(12) United States Patent
Tani et al.

(10) Patent No.: US 9,460,984 B2
(45) Date of Patent: Oct. 4, 2016

(54) HEAT DISSIPATING CIRCUIT BOARD AND ELECTRONIC DEVICE

(71) Applicant: NGK INSULATORS, LTD., Nagoya (JP)

(72) Inventors: Makoto Tani, Inazawa (JP); Yoshihiro Tanaka, Nagoya (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/041,167

(22) Filed: Feb. 11, 2016

(65) Prior Publication Data

US 2016/0163618 A1  Jun. 9, 2016

Related U.S. Application Data

(63) Continuation of application No. PCT/JP2014/071481, filed on Aug. 15, 2014.

(30) Foreign Application Priority Data

Aug. 16, 2013  (JP) ................................. 2013-169262

(51) Int. Cl.
 *H01L 23/10* (2006.01)
 *H01L 23/34* (2006.01)
 *H01L 23/373* (2006.01)
 *H01L 23/00* (2006.01)
 *H01L 23/498* (2006.01)
 *H01L 23/367* (2006.01)

(52) U.S. Cl.
 CPC ....... *H01L 23/3735* (2013.01); *H01L 23/3675* (2013.01); *H01L 23/49838* (2013.01); *H01L 23/49894* (2013.01); *H01L 23/562* (2013.01); *H05K 2201/10166* (2013.01)

(58) Field of Classification Search
 CPC ............. H01L 23/50; H01L 23/49822; H01L 2924/15174; H01L 2924/3511; H01L 224/162252
 USPC .......................... 257/706, 707, 691, 713, 734
 See application file for complete search history.

(56) References Cited

U.S. PATENT DOCUMENTS 5,731,067 A  3/1998 Asai et al.
6,232,657 B1  5/2001 Komorita et al.
(Continued)

FOREIGN PATENT DOCUMENTS

EP  0 874 399 A1  10/1998
JP  2003-086747 A1  3/2003
(Continued)

OTHER PUBLICATIONS

International Search Report and Written Opinion (Application No. PCT/JP2014/071481) dated Oct. 28, 2014.
Extended European Search Report (Application No. 14160455.3) dated Jan. 8, 2015.

*Primary Examiner* — S. V. Clark
(74) *Attorney, Agent, or Firm* — Burr & Brown, PLLC

(57) ABSTRACT

A heat dissipating circuit board for a power semiconductor includes an electrode material on which a power semiconductor is mounted on a front surface thereof, and a member bonded to a front surface side of the electrode material. The member is made up from a material which exhibits a lower coefficient of thermal expansion than that of the electrode material, and which exhibits a higher Young's modulus than that of the electrode material.

15 Claims, 12 Drawing Sheets

(56) References Cited

U.S. PATENT DOCUMENTS

| | | | | |
|---|---|---|---|---|
| 6,961,230 | B2* | 11/2005 | Otsuka | H01G 2/065 257/E23.062 |
| 8,437,173 | B2* | 5/2013 | Hayakawa | G11C 13/0007 257/3 |
| 2004/0257749 | A1* | 12/2004 | Otsuka | H01G 2/065 361/306.3 |
| 2005/0260794 | A1* | 11/2005 | Lo | H01L 23/3114 438/108 |
| 2013/0094165 | A1 | 4/2013 | Yano et al. | |
| 2015/0342027 | A1 | 11/2015 | Feichtinger et al. | |

FOREIGN PATENT DOCUMENTS

| | | |
|---|---|---|
| JP | 2006-041256 A1 | 2/2006 |
| JP | 2006-294890 A1 | 10/2006 |
| JP | 2007-095942 A1 | 4/2007 |
| JP | 2008-153430 A1 | 7/2008 |
| JP | 2011-222669 A1 | 11/2011 |
| JP | 2012-074591 A1 | 4/2012 |
| JP | 2014-053441 A1 | 3/2014 |
| WO | 2014/095587 A1 | 6/2014 |

* cited by examiner

HEAT DISSIPATING CIRCUIT BOARD AND ELECTRONIC DEVICE

CROSS-REFERENCE TO RELATED APPLICATIONS

This application is a Continuation of International Application No. PCT/JP2014/071481 filed on Aug. 15, 2014, which is based upon and claims the benefit of priority from Japanese Patent Application No. 2013-169262 filed on Aug. 16, 2013, the contents all of which are incorporated herein by reference.

BACKGROUND OF THE INVENTION

1. Field of the Invention

The present invention relates to a heat dissipating circuit board and an electronic device, and in particular, relates to a heat dissipating circuit board, which is suitable for use as a heat dissipating component for a power semiconductor, for example, of a bipolar transistor, a power-MOSFET (metal-oxide-semiconductor field-effect transistor), an IGBT (Insulated Gate Bipolar Transistor) or the like, as well as to an electronic device utilizing such a heat dissipating circuit board.

2. Description of the Related Art

Conventionally, as a heat dissipating circuit board for use with a power semiconductor, there has been proposed a device in which an electrode material and a heat spreader, which serve as heat dissipating members, are bonded through a heat transfer sheet. Further, a power semiconductor is mounted to a surface of the electrode material through a bonding layer of solder or the like (See, Japanese Laid-Open Patent Publication No. 2008-153430).

SUMMARY OF THE INVENTION

The aforementioned electrode material, in addition to having a heat dissipating function, also is required to function as a buffer layer for buffering momentary generation of heat, and hence a high thermal capacity and high thermal conductivity are required for the electrode material. Thus, in order to increase the thermal capacity of the electrode material, it may be considered to make the electrode material thicker.

However, if the electrode material is increased in thickness, since thermal stress increases at the bonding layer where the power semiconductor and the electrode material are bonded together, due to the heat cycle during usage thereof, cracking tends to occur in the bonding layer, and there is a concern that the power semiconductor will suffer from breakage.

The present invention has been devised taking into consideration the aforementioned problems, and has the object of providing a heat dissipating circuit board and an electronic device, in which thermal expansion of the electrode material, which is generated during a heat cycle, and in particular, thermal expansion of a surface of thereof on which at least a power semiconductor is mounted, can be suppressed, thermal stresses that occur at the bonding layer can be alleviated, and together therewith, an increase in thermal capacity can be achieved.

[1] A heat dissipating circuit board for a power semiconductor according to a first aspect of the present invention comprises an electrode material on which the power semiconductor is mounted on a front surface thereof, and a member bonded to a front surface side of the electrode material. The member is made up from a material which exhibits a lower coefficient of thermal expansion than that of the electrode material, and which exhibits a higher Young's modulus than that of the electrode material.

Because the member is bonded to the front surface side of the electrode material, thermal expansion of the electrode material, which is generated during the heat cycle, and in particular, thermal expansion of a surface on which at least the power semiconductor is mounted, can be suppressed, and thermal stresses applied to the bonding layer, which is used in mounting the power semiconductor, can be alleviated. In accordance therewith, generation of cracks in the bonding layer can be suppressed. Further, it is possible to increase the thickness of the electrode material, and the thermal capacity thereof can also be increased.

[2] In the first aspect of the present invention, the member may be formed in an annular shape along an outer circumference of the front surface of the electrode material.

[3] In the first aspect of the present invention, a plurality of the members may be provided, the plural members being arranged along an outer circumference of the front surface of the electrode material.

[4] In the first aspect of the present invention, two of the members may be bonded at linearly symmetric positions.

[5] In the first aspect of the present invention, a portion of the member may extend out in a transverse direction beyond an outer circumference of the front surface of the electrode material. In this case, positional alignment when the member is bonded to the front surface of the electrode material is simplified, so that a reduction in man-hours, an improvement in yield, and an improvement in productivity can be achieved.

[6] In the first aspect of the present invention, entirety of the member may be bonded within the front surface of the electrode material. In this case, the constituent material amount of the member can be kept to a minimum, and manufacturing costs can be reduced.

[7] In the first aspect of the present invention, a portion of the front surface of the electrode material may include a recess therein, and the member may be bonded in the recess. In this case, the surface (front surface of the electrode material) on which the power semiconductor is mounted is approximately at the same height as the surface of the member, or is greater in height than the surface of the member. Therefore, mounting of the power semiconductor can be facilitated and improved.

[8] In the first aspect of the present invention, furthermore, a ceramic substrate, which is bonded to a rear surface of the electrode material, may be provided. In accordance therewith, the occurrence of warping can be suppressed. Further, since the thickness of the electrode material can be increased, thermal resistance can effectively be reduced.

[9] In this case, at least material properties and thicknesses of the member and the ceramic substrate preferably are adjusted so as to suppress warping of the heat dissipating circuit board. Such a feature can be accomplished by adjusting the coefficients of thermal expansion, the Young's moduli, and thereby the respective thicknesses of the member and the ceramic substrate. For example, in the case that the Young's moduli of the member and the ceramic substrate are equal to each other, if the coefficient of thermal expansion of the member is less than that of the ceramic substrate, then the thickness of the member is made thinner than the ceramic substrate.

[10] A constituent material of the member may be a ceramic material, which is the same as the ceramic material of the ceramic substrate.

[11] A constituent material of the ceramic substrate may preferably be silicon nitride. Silicon nitride is preferably used since it exhibits high strength and toughness/tenacity as well as high thermal conductivity, and is highly resistant to cracks or splitting of the ceramic substrate due to the heat cycle.

[12] Furthermore, another electrode material may be bonded to an end surface of the ceramic substrate. Owing thereto, a heat sink can be bonded by way of solder application or a brazing material to an end surface of the other electrode material.

[13] A thickness of the electrode material preferably is greater than a thickness of the other electrode material. Since the thickness of the electrode material can be increased, thermal resistance can effectively be reduced.

[14] In this case, an inequality $t1>tb>t2$ may be satisfied, where tb represents a thickness of the ceramic substrate, t1 represents the thickness of the electrode material, and t2 represents the thickness of the other electrode material.

[15] An electronic device according to a second aspect of the present invention comprises a heat dissipating circuit board according to the aforementioned first aspect of the present invention, and a power semiconductor, which is mounted on the front surface of the electrode material of the heat dissipating circuit board.

As described above, in accordance with the heat dissipating circuit board and the electronic device according to the present invention, thermal expansion of the electrode material, which is generated during the heat cycle, and in particular, thermal expansion of a surface on which at least a power semiconductor is mounted, can be suppressed, thermal stresses that occur at the bonding layer can be alleviated, and together therewith, an increase in thermal capacity can be achieved.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Below, preferred embodiments of the heat dissipating circuit board according to the present invention will be described with reference to FIGS. 1A through 12C. In the present specification, the dash symbol "-" (or "to") shown in connection with numerical ranges implies that the numerical values appearing before and after the dash symbol include upper limit and lower limit values.

Figure 1A:
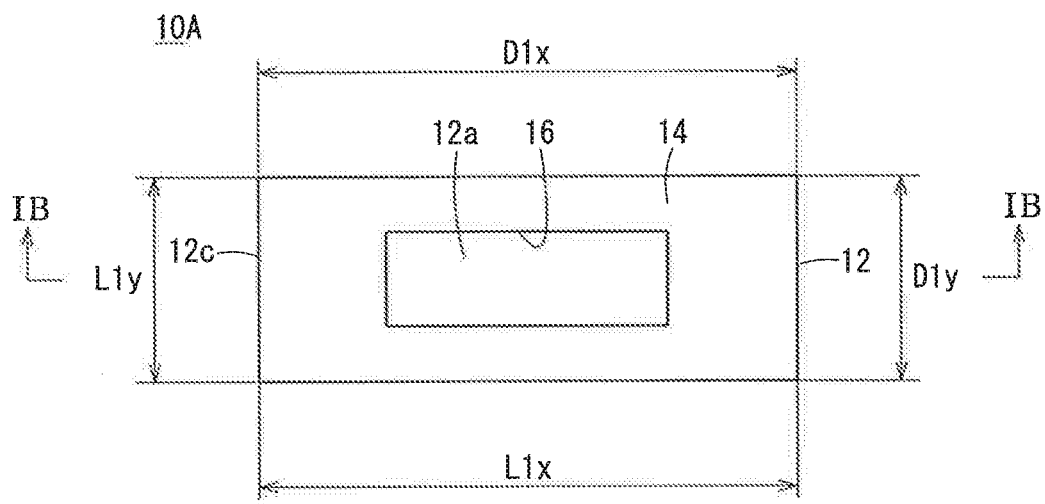
FIG. 1A is a plan view showing a heat dissipating circuit board (first heat dissipating circuit board) as viewed from an upper surface thereof according to a first embodiment of the present invention.
Figure 1B:
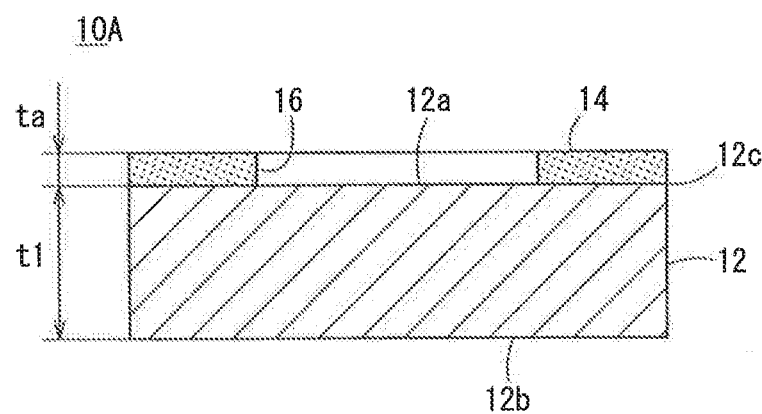
FIG. 1B is a cross-sectional view taken along line IB-IB in FIG. 1A.

First, as shown in FIGS. 1A and 1B, a heat dissipating circuit board (hereinafter referred to as a "first heat dissipating circuit board 10A") according to a first embodiment of the present invention includes an electrode material 12 on which a power semiconductor is mounted on a front surface thereof, and a member 14 which is bonded to the front surface side of the electrode material 12. The member 14 is made up from a material which exhibits a lower coefficient of thermal expansion than that of the electrode material 12, and which exhibits a higher Young's modulus than that of the electrode material 12.

The electrode material 12 can be made up from metal plates that exhibit high thermal conductivity, including Cu (copper) and Al (aluminum).

A ceramic material, a semiconductor material, a metallic material, and the like are preferably used as a constituent material of the member 14. The ceramic material includes by way of example, $Si_3N_4$ (silicon nitride), AlN (aluminum nitride), $Al_2O_3$ (alumina), SiC (silicon carbide), cordierite, mullite and the like. The semiconductor material includes by way of example, Si (silicon), GaN (gallium nitride), SiC and the like. The metallic material includes by way of example, W (tungsten), Mo (molybdenum), Cr (chromium), Nb (niobium), Ir (iridium), and an alloy containing these materials as the main component (CuMo, CuW, and the like).

The member 14 preferably has the thickness of 100 µm or more, and 1 mm or less, and exhibits the coefficient of thermal expansion of 10 ppm/K or less. The Young's modulus of the member 14 is preferably higher than that of the electrode material 12. For example, in the case that the electrode material 12 is made of copper, the Young's modulus of the member 14 is preferably 130 GPa or more, the occurrence of cracks in a bonding layer 18 due to the heat cycle (described later) can be avoided effectively.

Concerning the bond between the member 14 and the electrode material 12, brazing through an Ag—Cu (silver/copper) type brazing material and the like may be used in the case that the constituent material of the member 14 is a ceramic or semiconductor material. Alternatively, in the case that the constituent material of the member 14 is a metallic material, coating such as thermal spraying may be used, as well as brazing.

In addition, in the first heat dissipating circuit board 10A, an annular member 14 is bonded to a front surface 12a (flat surface) of the electrode material 12. In particular, with the example of FIGS. 1A and 1B, the member 14 is formed in an annular shape along an outer circumference 12c of the front surface 12a of the electrode material 12. The "front surface 12a of the electrode material 12" is defined by a surface (e.g., the upper surface shown in FIG. 1B) on which a power semiconductor 20 (see FIG. 2A) is mounted, whereas the "rear surface" thereof is defined by a surface (e.g., the lower surface shown in FIG. 1B) opposite from the front surface 12a.

Various shapes may be used for the shape of the electrode material 12, although as viewed from the upper surface thereof in FIG. 1A, a rectangular shape is shown. In the center of the member 14, a hole 16 is formed, which similarly is of a rectangular shape, with the front surface 12a of the electrode material 12 being exposed through the hole 16. Further, the inequality t1>ta is satisfied, where t1 represents the thickness of the electrode material 12, and ta represents the thickness of the member 14.

Apart from the above-described rectangular shape, the outer shape of the electrode material 12 may be a square shape, a circular shape, an elliptical shape, a track-like shape, or any of various polygonal shapes such as triangles, pentagons, hexagons, or the like.

Figure 2A:
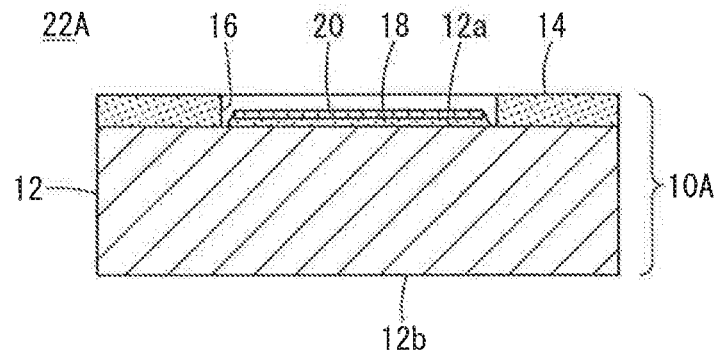
FIG. 2A is a vertical cross-sectional view showing an electronic device (first electronic device) according to the first embodiment.
Figure 2B:
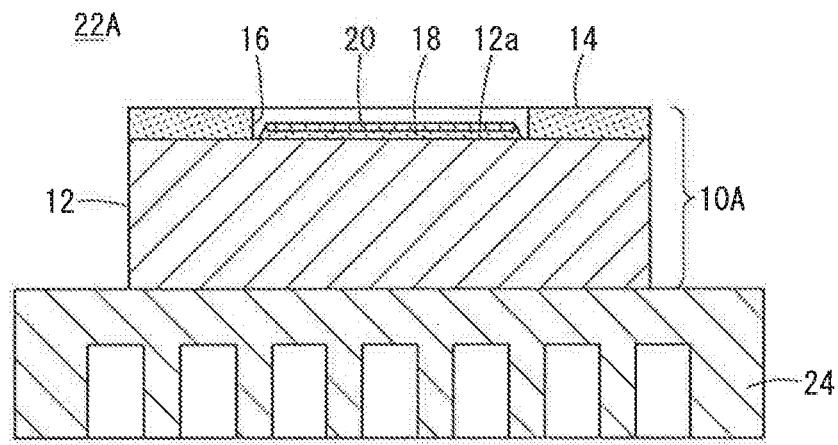
FIG. 2B is a vertical cross-sectional view showing another example of the first electronic device.
Figure 2C:
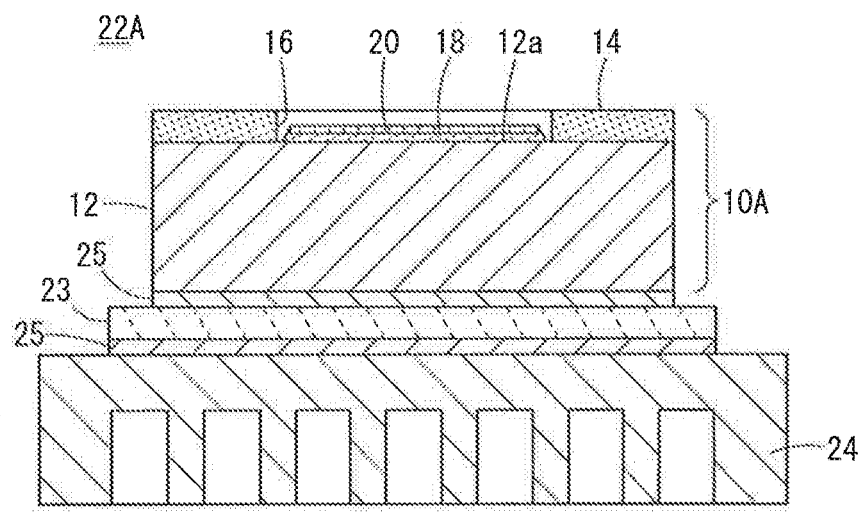
FIG. 2C is a vertical cross-sectional view showing still another example of the first electronic device.
Figure 3A:
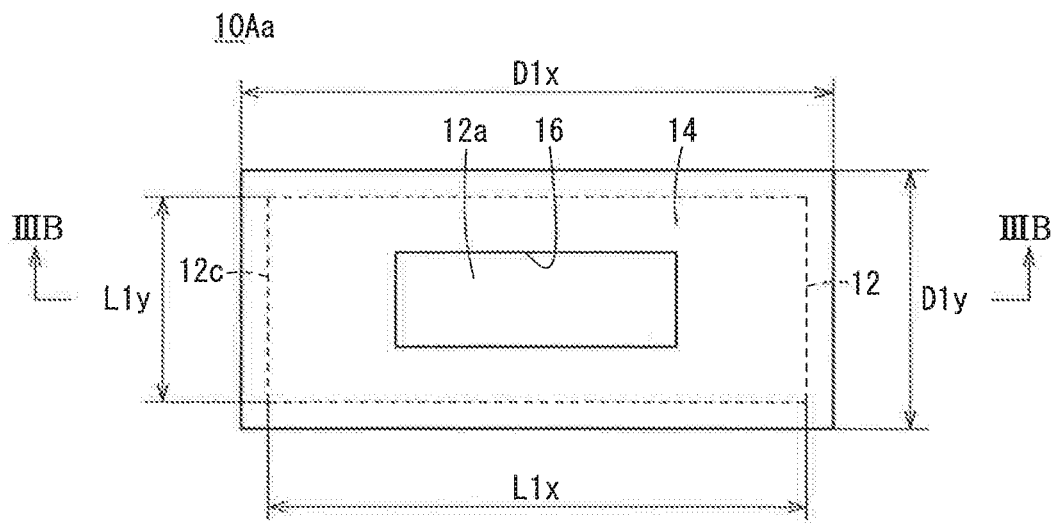
FIG. 3A is a plan view showing a first modification as viewed from an upper surface of the first heat dissipating circuit board.
Figure 3B:
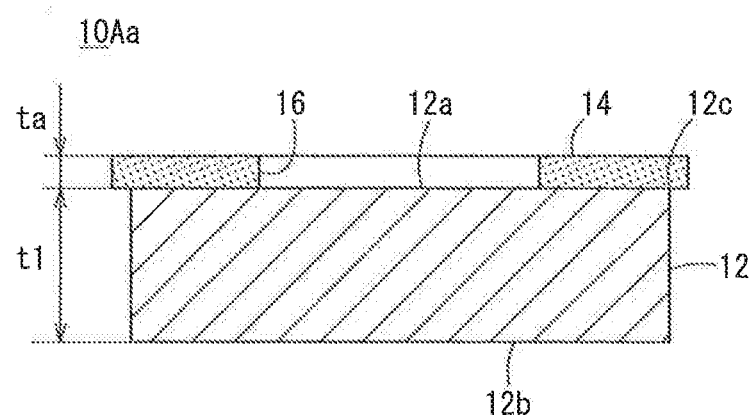
FIG. 3B is a cross-sectional view taken along line IIIB-IIIB in FIG. 3A.
Figure 4A:
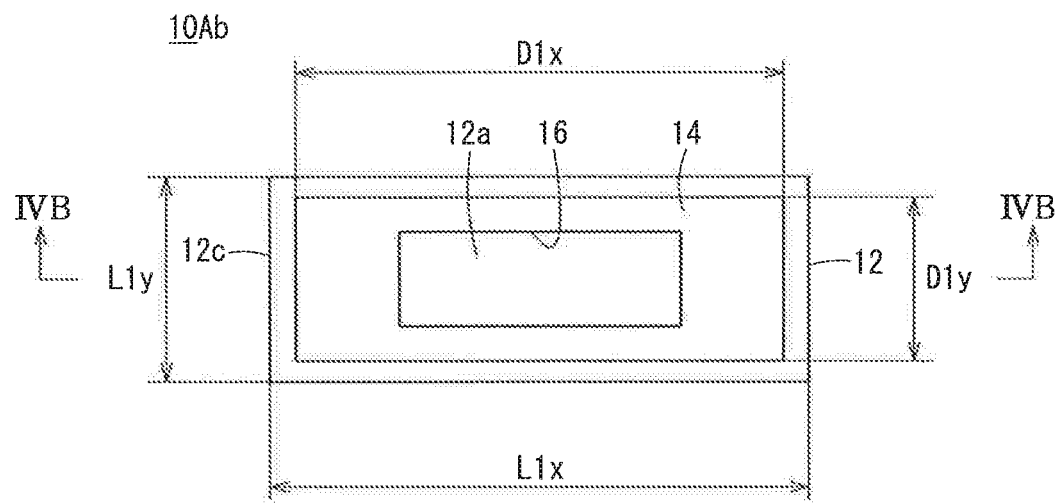
FIG. 4A is a plan view showing a second modification as viewed from an upper surface of the first heat dissipating circuit board.
Figure 4B:
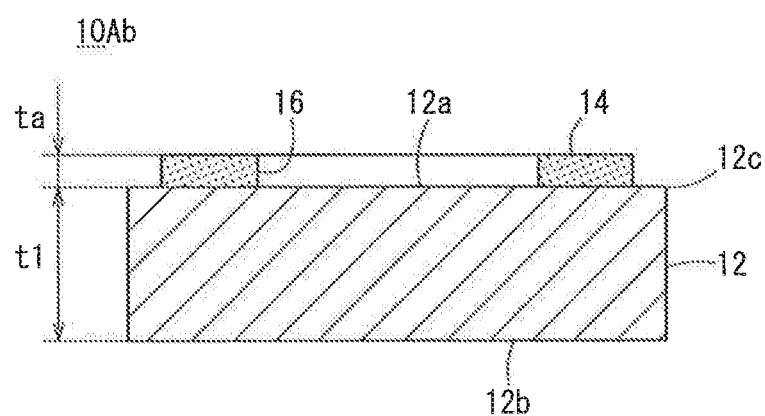
FIG. 4B is a cross-sectional view taken along line IVB-IVB in FIG. 4A.

In addition, as shown in FIG. 2A, the power semiconductor 20 is mounted through the bonding layer 18 of solder or the like to the front surface 12a of the electrode material 12, whereby an electronic device (hereinafter referred to as a "first electronic device 22A") is made up according to the first embodiment of the invention. As shown in FIG. 2B, it is a matter of course that the first electronic device 22A may also be constituted by further bonding a heat sink 24 to a rear surface 12b of the electrode material 12. As shown in FIG. 2C, an insulating substrate 23, which is made of a material such as AlN, $Si_3N_4$, and $Al_2O_3$, may be interposed between the rear surface 12b of the electrode material 12 and the heat sink 24. In this case, a thermal conductive grease or TIM (thermal interface material) 25 or the like may be interposed between the electrode material 12 and the insulating substrate 23, and between the insulating substrate 23 and the heat sink 24, respectively, in bonding these elements. Moreover, as shown in FIGS. 2A through 2C, etc., although the height of the power semiconductor 20 is illustrated as being thinner than the thickness of the member 14, the invention is not limited to this feature.

In the first heat dissipating circuit board 10A, because the member 14 is bonded to the front surface 12a of the electrode material 12, thermal expansion of the electrode material 12, which is generated during the heat cycle, and in particular, thermal expansion of a surface on which at least the power semiconductor 20 is mounted, can be suppressed, and thermal stresses applied to the bonding layer 18 can be alleviated. In accordance therewith, generation of cracks in the bonding layer 18 can be suppressed. Further, it is possible to increase the thickness t1 of the electrode material 12, and the thermal capacity thereof can also be increased.

Next, several modifications of the first heat dissipating circuit board 10A will be described with reference to FIGS. 3A through 9B.

Any of the following relationships may be adopted as the relationship between the length D1y in the vertical direction and the length D1x in the horizontal (transverse) direction of the member 14 as the member 14 is viewed from the upper surface thereof, and the length L1y in the vertical direction and the length L1x in the horizontal direction of the electrode material 12.

$$D1y=L1y, D1x=L1x \qquad (A-1)$$

$$D1y>L1y, D1x=L1x \qquad (A-2)$$

$$D1y<L1y, D1x=L1x \qquad (A-3)$$

$$D1y=L1y, D1x>L1x \qquad (A-4)$$

$$D1y>L1y, D1x>L1x \qquad (A-5)$$

$$D1y<L1y, D1x>L1x \qquad (A-6)$$

$$D1y=L1y, D1x<L1x \qquad (A-7)$$

$$D1y>L1y, D1x<L1x \qquad (A-8)$$

$$D1y<L1y, D1x<L1x \qquad (A-9)$$

Among these relationships, the example of (A-1) is shown for the above-described first heat dissipating circuit board 10A (see FIGS. 1A and 1B).

Among the aforementioned dimensional relationships, the examples of (A-2), (A-4), (A-5), (A-6), and (A-8) are illustrative of examples in which portions of the member 14 extend out in the lateral (transverse) direction beyond the outer circumference 12c of the front surface 12a of the electrode material 12. The example of (A-5) (i.e., a first heat dissipating circuit board 10Aa according to a first modification) is shown representatively in FIGS. 3A and 3B. With the first modification, positional alignment when the member 14 is bonded to the front surface 12a of the electrode material 12 is simplified, a reduction in man-hours, an improvement in yield, and an improvement in productivity can be achieved.

The examples of (A-3), (A-7), and (A-9) are illustrative of examples in which the entirety of the member 14 is bonded within the front surface 12a of the electrode material 12. The example of (A-9) (i.e., a first heat dissipating circuit board 10Ab according to a second modification) is shown representatively in FIGS. 4A and 4B. With the second modification, the constituent material amount of the member 14 can be kept to a minimum, and manufacturing costs can be reduced.

First heat dissipating circuit boards 10Ac and 10Ad according to third and fourth modifications are substantially the same in structure as the first heat dissipating circuit board 10A, but differ therefrom in that, as shown in FIGS. 5A through 6B, plural members 14 are arranged along the outer circumference 12c of the front surface 12a of the electrode material 12. With the third modification and the fourth modification, production of the members 14 is simplified, so that a reduction in man-hours, an improvement in yield, and an improvement in productivity can be achieved.

Figure 5A:
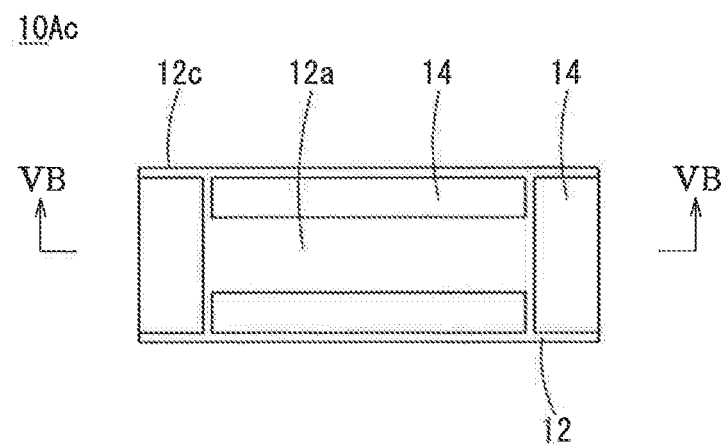
FIG. 5A is a plan view showing a third modification as viewed from an upper surface of the first heat dissipating circuit board.
Figure 5B:
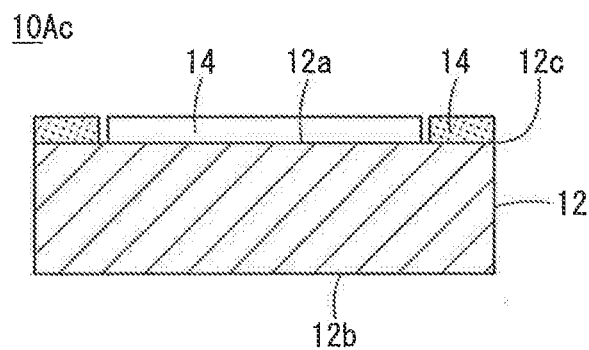
FIG. 5B is a cross-sectional view taken along line VB-VB in FIG. 5A.
Figure 6A:
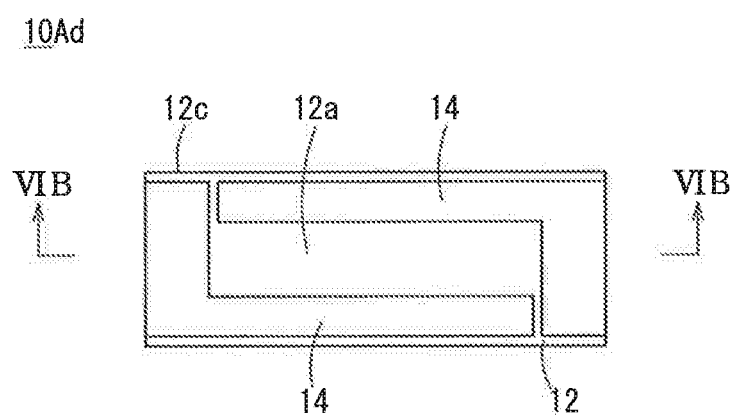
FIG. 6A is a plan view showing a fourth modification as viewed from an upper surface of the first heat dissipating circuit board.
Figure 6B:
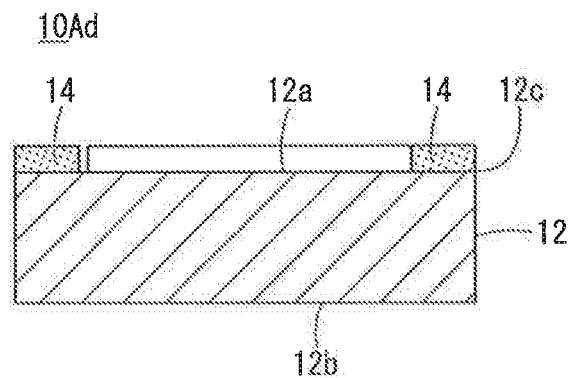
FIG. 6B is a cross-sectional view taken along line VIB-VIB in FIG. 6A.

With the third modification, as shown in FIGS. 5A and 5B, four flat plate-shaped members 14 that extend in straight line shapes are arranged along the outer circumference 12c of the front surface 12a of the electrode material 12. With the fourth modification, as shown in FIGS. 6A and 6B, two flat plate-shaped members 14, which are bent in the shape of the letter L, are arranged along the outer circumference 12c of the front surface 12a of the electrode material 12.

Figure 7A:
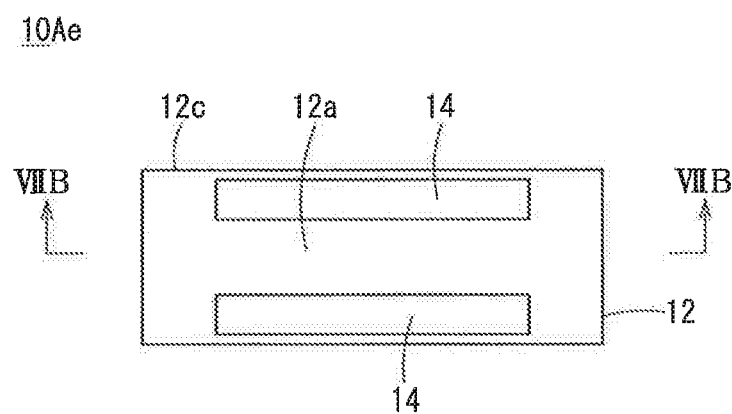
FIG. 7A is a plan view showing a fifth modification as viewed from an upper surface of the first heat dissipating circuit board.
Figure 7B:
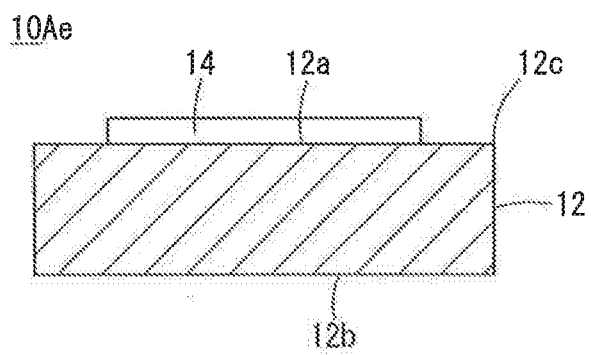
FIG. 7B is a cross-sectional view taken along line VIIB-VIIB in FIG. 7A.

As shown in FIGS. 7A and 7B, a first heat dissipating circuit board 10Ae according to a fifth modification includes a configuration in which certain ones of the members 14 are omitted from the aforementioned third modification. In FIGS. 7A and 7B, an example is illustrated in which two of the members 14 having longer sides extending in the same direction are bonded (i.e., two members 14 that extend in straight lines are bonded at linearly symmetric positions, respectively). With the fifth modification, the constituent material amount of the member 14 can be kept to a minimum, and manufacturing costs can be reduced.

Figure 8A:
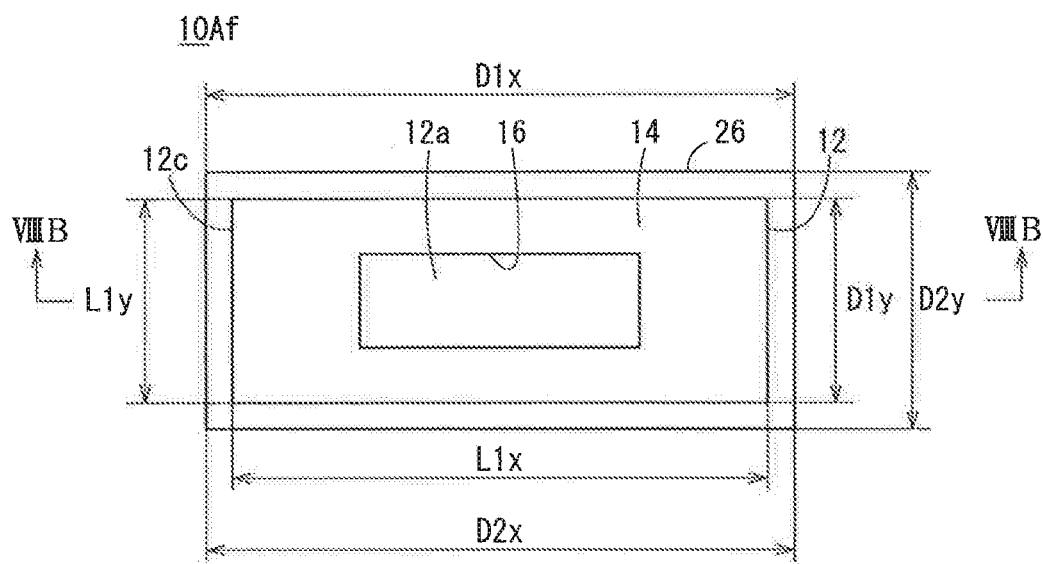
FIG. 8A is a plan view showing a sixth modification as viewed from an upper surface of the first heat dissipating circuit board.
Figure 8B:
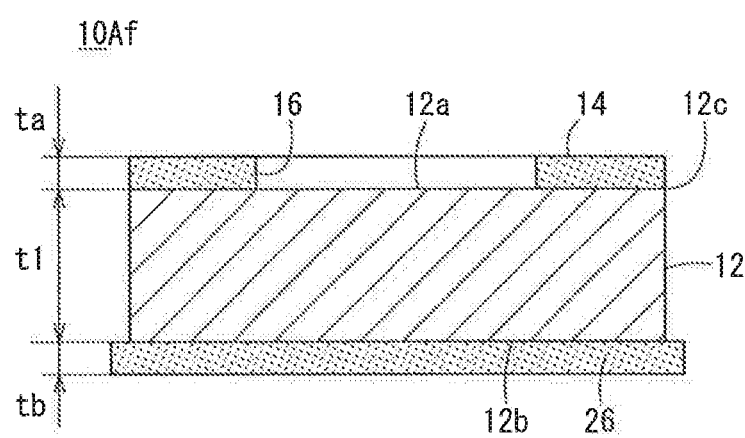
FIG. 8B is a cross-sectional view taken along line VIIIB-VIIIB in FIG. 8A.

A first heat dissipating circuit board 10Af according to a sixth modification differs in that, as shown in FIGS. 8A and 8B, a ceramic substrate 26 is bonded to the rear surface 12b of the electrode material 12.

The length D2y in the vertical direction and the length D2x in the horizontal (transverse) direction as viewed from the upper surface of the ceramic substrate 26 are longer than the length L1y in the vertical direction and the length L1x in the horizontal direction of the electrode material 12. The ceramic substrate 26 can be made up from ceramics that exhibit high thermal conductivity, such as AlN or $Si_3N_4$. Concerning the bond between the electrode material 12 and the ceramic substrate 26, direct bonding, or bonding through a brazing material may be used.

Further, the following relationships are satisfied:

$$ta \cong tb$$

$$t1 > tb$$

where t1 represents the thickness of the electrode material 12, ta represents the thickness of the member 14, and tb represents the thickness of the ceramic substrate 26.

In the sixth modification, the occurrence of warping can be suppressed, because the ceramic substrate 26 also is bonded to the rear surface 12b of the electrode material 12.

Further, since the thickness t1 of the electrode material 12 can be increased, thermal resistance can effectively be reduced.

Further, as the member 14 and the ceramic substrate 26, elements preferably are used in which at least material properties and thicknesses thereof are adjusted so as to suppress warping of the first heat dissipating circuit board 10A. Such a feature can be accomplished by adjusting the coefficients of thermal expansion, the Young's moduli, and thereby the respective thicknesses of the member 14 and the ceramic substrate 26. For example, in the case that the Young's moduli of the member 14 and the ceramic substrate 26 are equal to each other, if the coefficient of thermal expansion of the member 14 is less than that of the ceramic substrate 26, then the thickness of the member 14 is made thinner than the ceramic substrate 26. Further, the constituent materials of the member 14 and the ceramic substrate 26 may be of the same type; for example, the constituent material of the member 14 may be a ceramic. More specifically, in the case that the constituent material of the ceramic substrate 26 is $Si_3N_4$, the member 14 may also be constituted from $Si_3N_4$ or the like. $Si_3N_4$ exhibits high strength and toughness/tenacity as well as high thermal conductivity, and is highly resistant to cracks or splitting of the ceramic substrate 26 due to the heat cycle. Therefore, $Si_3N_4$ is preferably used.

Figure 9A:
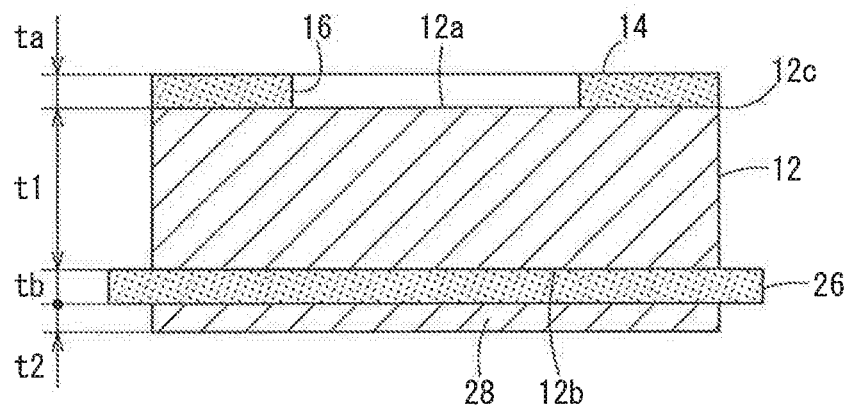
FIG. 9A is a vertical cross-sectional view showing a seventh modification of the first heat dissipating circuit board.

A first heat dissipating circuit board 10Ag according to a seventh modification is substantially the same in structure as the aforementioned sixth modification, but differs therefrom in that, as shown in FIG. 9A, another electrode material 28 is bonded to the rear surface of the ceramic substrate 26. In the seventh modification, the electrode material 12, which is bonded to the front surface of the ceramic substrate 26, is referred to as a first electrode material 12, whereas the other electrode material 28, which is bonded to the rear surface of the ceramic substrate 26, is referred to as a second electrode material 28.

The lengths in the vertical direction and the lengths in the horizontal direction of both the first electrode material 12 and the second electrode material 28 are substantially the same, respectively.

Further, the following inequality is satisfied:

$$t1 > tb > t2$$

where tb represents the thickness of the ceramic substrate 26, t1 represents the thickness of the first electrode material 12, and t2 represents the thickness of the second electrode material 28.

Figure 9B:
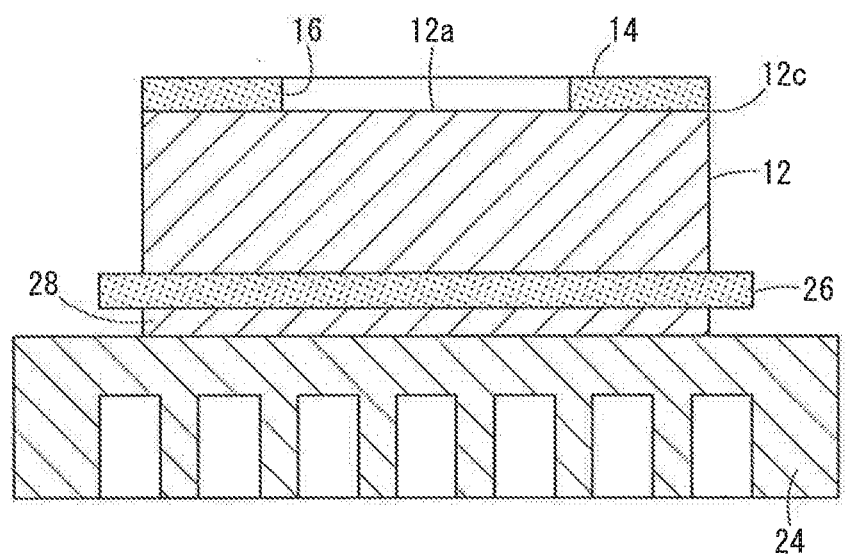
FIG. 9B is a vertical cross-sectional view showing a condition in which a heat sink is bonded to an end surface of another electrode material (second electrode material) in the seventh modification.

In the seventh modification, similar to the aforementioned sixth modification, warping can be suppressed, and further, since the thickness t1 of the first electrode material 12 can be increased, thermal resistance can effectively be reduced. Further, as shown in FIG. 9B, a heat sink 24 can be bonded by way of solder application or a brazing material to an end surface of the second electrode material 28.

Next, a heat dissipating circuit board (hereinafter referred to as a "second heat dissipating circuit board 10B") according to a second embodiment of the present invention will be described below with reference to FIGS. 10A through 12C.

The second heat dissipating circuit board 10B is substantially the same in structure as the above-described first heat dissipating circuit board 10A, but differs therefrom in that a recess 30 (see FIG. 10B) is included in a portion of the front surface 12a of the electrode material 12, and the member 14 is bonded by being embedded in the recess 30.

The recess 30 is formed in an annular shape around the outer circumference 12c of the front surface 12a of the electrode material 12. In particular, with the example shown in FIGS. 10A and 10B, the outer circumference 12c of the front surface 12a of the electrode material 12 constitutes a portion of the recess 30. In other words, the recess 30 is formed to extend from the front surface 12a to a side surface 12d of the electrode material 12. Therefore, the electrode material 12 has a shape such that a shoulder portion thereof is cut out by the recess 30. Further, the member 14 is formed in a shape along the annular shape of the recess 30. More specifically, the member 14 is bonded in an embedded fashion in the recess 30 of the electrode material 12. Preferably, the member 14 is bonded through a brazing material such as an Ag—Cu type brazing material or the like from a bottom surface 30a of the recess 30 to a side surface 30b thereof.

Figure 10A:
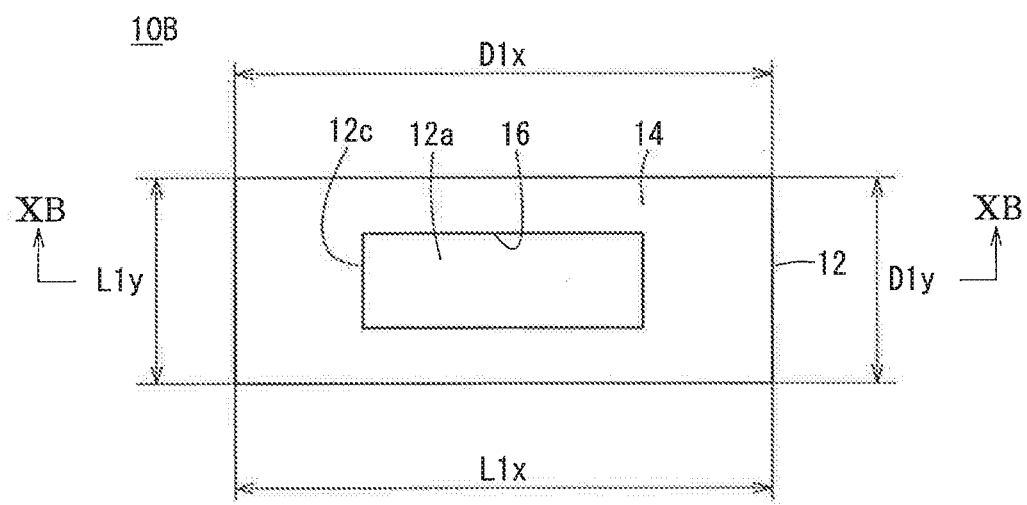
FIG. 10A is a plan view showing a heat dissipating circuit board (second heat dissipating circuit board) as viewed from an upper surface thereof according to a second embodiment of the present invention.
Figure 10B:
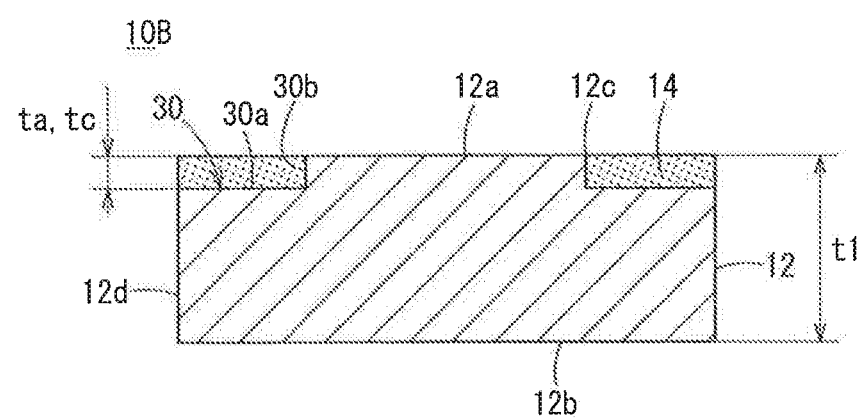
FIG. 10B is a cross-sectional view taken along line XB-XB in FIG. 10A.
Figure 11A:
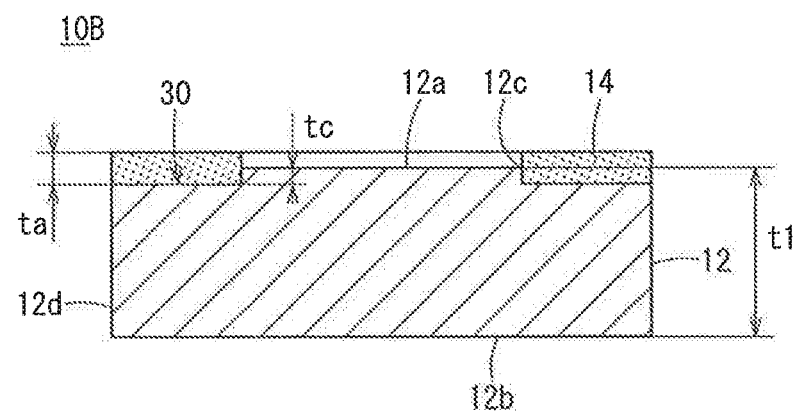
FIG. 11A is a vertical cross-sectional view showing a condition in which the depth of a recess in the second heat dissipating circuit board is shallower than the thickness of the member.
Figure 11B:
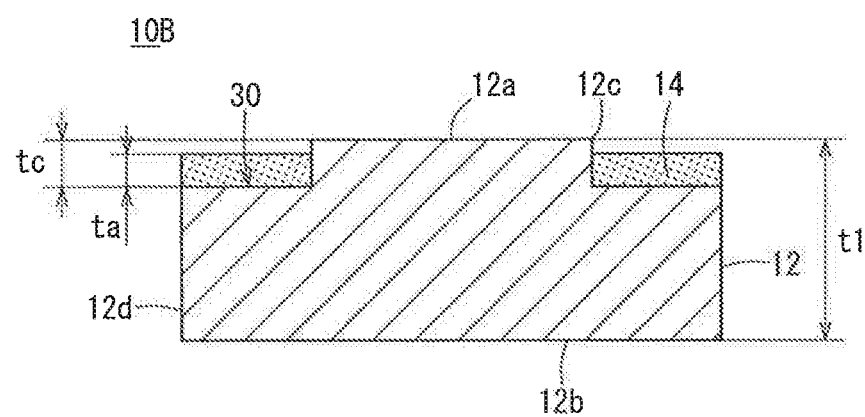
FIG. 11B is a vertical cross-sectional view showing a condition in which the depth of a recess in the second heat dissipating circuit board is deeper than the thickness of the member.

As shown in FIG. 10B, the depth tc of the recess 30 may be the same as the thickness ta of the member 14, or may be shallower than the thickness ta of the member 14 as shown in FIG. 11A. Alternatively, as shown in FIG. 11B, the depth tc of the recess 30 may be deeper than the thickness ta of the member 14.

Figure 12A:
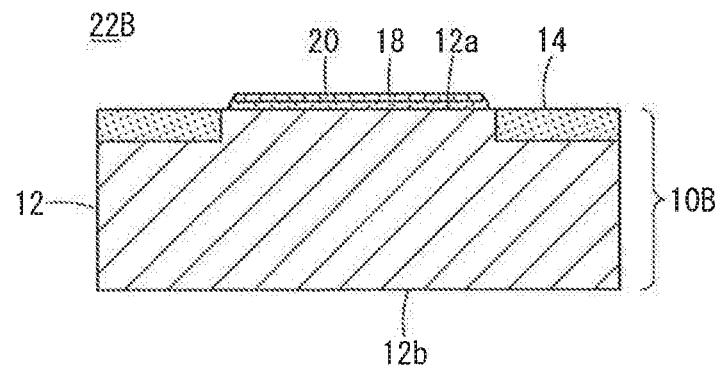
FIG. 12A is a vertical cross-sectional view showing an electronic device (second electronic device) according to the second embodiment.
Figure 12B:
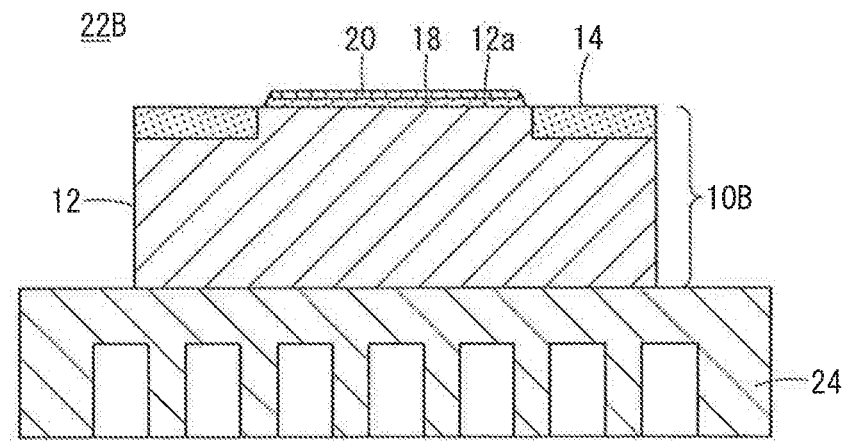
FIG. 12B is a vertical cross-sectional view showing another second electronic device.

In addition, as shown in FIG. 12A, the power semiconductor 20 is mounted through a bonding layer 18 of solder or the like to the front surface 12a of the electrode material 12, whereby an electronic device (hereinafter referred to as a "second electronic device 22B") is made up according to the second embodiment of the invention. As shown in FIG. 12B, it is a matter of course that the second electronic device 22B may also be constituted by further bonding a heat sink 24 to a rear surface 12b of the electrode material 12.

In the second heat dissipating circuit board 10B, because the member 14 is bonded to the front surface 12a of the electrode material 12, thermal expansion of the electrode material 12, which is generated during the heat cycle, and in particular, thermal expansion of a surface on which at least the power semiconductor 20 is mounted, can be suppressed, and thermal stresses applied to the bonding layer 18 can be alleviated. In accordance therewith, generation of cracks in the bonding layer 18 can be suppressed. It is possible to increase the thickness t1 of the electrode material 12, and the thermal capacity thereof can also be increased. Further, the surface (front surface 12a of the electrode material 12) on which the power semiconductor 20 is mounted is approximately at the same height as the surface of the member 14, or is greater in height than the surface of the member 14. Therefore, mounting of the power semiconductor 20 can be facilitated and improved.

In the second heat dissipating circuit board 10B, the same structures as those of the respective modifications described above for the first heat dissipating circuit board 10A can be adopted.

More specifically, any of the relationships (A-1) through (A-9) may be adopted as the relationship between the length D1y in the vertical direction and the length D1x in the horizontal (transverse) direction of the member 14, and the length L1y in the vertical direction and the length L1x in the horizontal direction of the electrode material 12.

Further, a plurality of the members 14 may be arranged along the outer circumference 12c of the front surface 12a of the electrode material 12, and two of the members 14 may be bonded such that their longer sides extend in the same direction, respectively. A ceramic substrate 26 may be bonded to the rear surface 12b of the electrode material 12, and further, the other electrode material 28 may be bonded to the rear surface of the ceramic substrate 26.

Figure 12C:
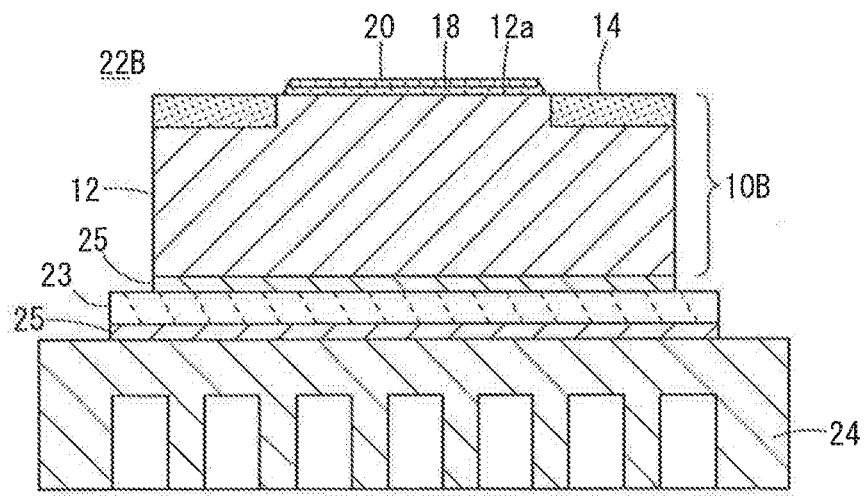
FIG. 12C is a vertical cross-sectional view showing still another example of the second electronic device.

Further, as shown in FIG. 12C, an insulating substrate 23, which is made of a material such as AlN, $Si_3N_4$, and $Al_2O_3$, may be interposed between the rear surface 12b of the electrode material 12 and the heat sink 24. In this case, a thermal conductive grease or TIM (thermal interface material) 25 or the like may be interposed between the electrode material 12 and the insulating substrate 23, and between the insulating substrate 23 and the heat sink 24, respectively, in bonding these elements.

EXAMPLES

First Example

An evaluation as to the presence or absence of cracks in the bonding layer 18 was performed with respect to Inventive Examples 1 through 4 and Comparison Example 1, and an evaluation as to the presence or absence of cracks in the bonding layer 18 and the ceramic substrate 26 was performed with respect to Inventive Examples 5 and 6. The results of these evaluations are shown in Table 1 and Table 2, which will be discussed below.

For the ceramic substrate 26 and the member 14, a silicon nitride ($Si_3N_4$) board was prepared having a thickness of 0.3 mm with a bending (flexural) strength of 650 MPa. For the electrode material 12 and the other electrode material 28, an oxygen-free copper (Cu) plate was prepared. Further, an Ag—Cu type brazing material paste, to which there was added a Ti active metal powder, was prepared.

Example 1

A heat dissipating circuit board for evaluation according to Example 1 included a structure similar to that of the first heat dissipating circuit board 10A shown in FIGS. 1A and 1B. More specifically, an annular (ring-shaped) member 14 was used (denoted by the term "(annular)" in Table 1).

At first, a brazing material was coated at a thickness of 10 μm on the member 14, and a Cu plate (electrode material 12) was bonded with the member 14. The thickness t1 of the electrode material 12 was 2 mm. The bonding conditions were such that heated pressure bonding was carried out under a vacuum at a temperature of 800° C. and a pressure of 1 MPa. Thereafter, as shown in FIG. 2A, a power semiconductor 20 was bonded through a bonding layer 18 (in this case, a solder layer) to thereby obtain an evaluation sample according to Example 1. Ten of such evaluation samples were prepared.

Example 2

A heat dissipating circuit board for evaluation according to Example 2 included a structure similar to that of the first heat dissipating circuit board 10Ac according to the third modification shown in FIGS. 5A and 5B. More specifically, four members 14 were arranged and bonded along the outer circumference 12c of the front surface 12a of the electrode material 12 (denoted by the term "(division 1)" in Table 1). Otherwise, features thereof were the same as those of Example 1, and ten of such evaluation samples according to Example 2 were prepared.

Example 3

A heat dissipating circuit board for evaluation according to Example 3 included a structure similar to that of the first heat dissipating circuit board 10Ae according to the fifth modification shown in FIGS. 7A and 7B. More specifically, two members 14 extending in straight line shapes were arranged and bonded at linearly symmetric positions, respectively (denoted by the term "(division 2)" in Table 1). Otherwise, features thereof were the same as those of Example 1, and ten of such evaluation samples according to Example 3 were prepared.

Example 4

A heat dissipating circuit board for evaluation according to Example 4 included a structure similar to that of the second heat dissipating circuit board 10B shown in FIGS. 10A and 10B. More specifically, an outer circumferential portion of the front surface 12a of the electrode material 12 was subjected to etching to thereby form an annular recess 30, and a ring-shaped member 14 was embedded and bonded in the recess 30 (denoted by the term "(embedded)" in Table 1). Otherwise, features thereof were the same as those of Example 1, and ten of such evaluation samples according to Example 4 were prepared.

Example 5

A heat dissipating circuit board for evaluation according to Example 5 included a structure similar to that of the first heat dissipating circuit board 10Af according to the sixth modification shown in FIGS. 8A and 8B. More specifically, the ceramic substrate 26 was bonded to the rear surface 12b of the electrode material 12. Otherwise, features thereof were the same as those of Example 1, and ten of such evaluation samples according to Example 5 were prepared.

Example 6

A heat dissipating circuit board for evaluation according to Example 6 included a structure similar to that of the first heat dissipating circuit board 10Ag according to the seventh modification shown in FIG. 9A. More specifically, the ceramic substrate 26 was bonded to the rear surface 12b of the electrode material 12, and further, the other electrode material 28 was bonded to the end surface of the ceramic substrate 26. Otherwise, features thereof were the same as those of Example 1, and ten of such evaluation samples according to Example 6 were prepared.

Comparative Example 1

A heat dissipating circuit board for evaluation according to Comparative Example 1 was the same as Inventive Example 1, except that the member 14 was not bonded to the front surface 12a of the electrode material 12. Ten of such evaluation samples according to Comparative Example 1 were prepared.

<Evaluation>

First, as an evaluation method, a heat cycle test was carried out over a temperature range of −40° C. to 125° C.

The number of cycles was 100 cycles. Per each cycle, the temperature was held at −40° C. (low temperature) for 30 minutes and at 125° C. (high temperature) for 30 minutes. Upon completion of the heat cycle test, with respect to Examples 1 through 4 and Comparative Example 1, the occurrence ratio of cracks in the bonding layer 18 was evaluated, and with respect to Examples 5 and 6, the occurrence ratio of cracks in the bonding layer 18 and the occurrence ratio of cracks in the ceramic substrate 26 were evaluated.

The occurrence ratio of cracks in the bonding layer 18 was represented by, from among ten evaluation samples, the number of evaluation samples for which cracks were generated in the bonding layer 18. The occurrence ratio of cracks in the ceramic substrate 26 was represented by, from among ten evaluation samples, the number of evaluation samples for which cracks were generated in the ceramic substrate 26. In Table 1 and Table 2, the ratios are expressed by [The Number of Evaluation Samples in which Cracks were Generated]/[The Evaluation Sample Parameter (=10)]. Evaluation results for Inventive Examples 1 to 4 and Comparative Example 1 are shown in Table 1 below, whereas evaluation results for Inventive Examples 5 and 6 are shown in Table 2.

TABLE 1

| | PRESENCE OR ABSENCE OF MEMBER | THICKNESS OF ELECTRODE MATERIAL | OCCURRENCE RATIO OF CRACKS IN BONDING LAYER |
| --- | --- | --- | --- |
| EXAMPLE 1 | Present (annular) | 2 mm | 0/10 |
| EXAMPLE 2 | Present (division 1) | 2 mm | 0/10 |
| EXAMPLE 3 | Present (division 2) | 2 mm | 0/10 |
| EXAMPLE 4 | Present (embedded) | 2 mm | 0/10 |
| COMPARATIVE EXAMPLE 1 | Absent | 2 mm | 10/10 |

TABLE 2

| | PRESENCE OR ABSENCE OF MEMBER | THICKNESS OF ELECTRODE MATERIAL | PRESENCE OR ABSENCE OF CERAMIC SUBSTRATE | THICKNESS OF OTHER ELECTRODE MATERIAL | OCCURRENCE RATIO OF CRACKS IN BONDING LAYER | OCCURRENCE RATIO OF CRACKS IN CERAMIC SUBSTRATE |
| --- | --- | --- | --- | --- | --- | --- |
| EXAMPLE 5 | Present | 2 mm | present | 0 mm | 0/10 | 0/10 |
| EXAMPLE 6 | Present | 2 mm | present | 0.1 mm | 0/10 | 0/10 |

From Table 1, it can be understood that, in the evaluation samples according to Examples 1 to 4, cracks were not generated in any of the bonding layers 18. This can be considered to have occurred from the fact that, because the member 14 (ceramic) was bonded to the front surface 12a of the electrode material 12, thermal expansion of the electrode material 12, which is generated during the heat cycle, and in particular, thermal expansion of a surface on which at least the power semiconductor 20 is mounted, could be suppressed, and thermal stresses applied to the bonding layer 18 were alleviated.

In contrast thereto, in Comparative Example 1, in all of the ten evaluation samples, cracks were generated in the bonding layer 18.

On the other hand, in either of Examples 5 and 6, as shown in Table 2, no cracks were generated in the bonding layer 18 or in the ceramic substrate 26. This can be considered to have occurred from the fact that, because the member 14 (ceramic) was bonded to the front surface 12a of the electrode material 12, similar to the case of Examples 1 through 4, thermal stresses applied to the bonding layer 18 were alleviated, and warping was suppressed due to the fact that the ceramic substrate 26 was bonded to the rear surface 12b of the electrode material 12.

Second Example

An evaluation as to the presence or absence of cracks in the bonding layer 18 was performed with respect to Inventive Examples 7 through 13. The results of these evaluations are shown in Table 3, which will be discussed below.

For the electrode material 12, an oxygen-free copper (Cu) plate was prepared. The oxygen-free Cu plate exhibited the coefficient of thermal expansion of 16.5 ppm/K, and the Young's modulus of 129.8 GPa. Further, an Ag—Cu type brazing material paste, to which there was added a Ti active metal powder, was prepared.

Example 7

For the member 14, an alumina ($Al_2O_3$) board was prepared having a thickness of 0.3 mm. The $Al_2O_3$ board exhibited the coefficient of thermal expansion of 7.2 ppm/K, and the Young's modulus of 310 GPa. An evaluation sample of a ceramic circuit board according to Example 7 included a structure similar to that of the first heat dissipating circuit board 10A shown in FIGS. 1A and 1B, as with the above-mentioned First Example. More specifically, an annular (ring-shaped) member 14 was used.

At first, a brazing material was coated at a thickness of 10 μm on the member 14, and the member 14 was bonded to a Cu plate (the electrode material 12). The thickness t1 of the electrode material 12 was 2 mm. The bonding conditions were such that heated pressure bonding was carried out under a vacuum at a temperature of 800° C. and a pressure of 1 MPa. Thereafter, as shown in FIG. 2A, a power semiconductor 20 was bonded through a bonding layer 18 (in this case, a solder layer) to thereby obtain an evaluation sample according to Example 7. Ten of such evaluation samples were prepared.

Example 8

For the member 14, an alumina-zirconia ($Al_2O_3$-$ZrO_2$) board was prepared having a thickness of 0.3 mm. Otherwise, features thereof were the same as those of Example 7, and ten of such evaluation samples according to Example 8 were prepared. The $Al_2O_3$-$ZrO_2$ board contained 80% by mass $Al_2O_3$ and 20% by mass $ZrO_2$. The $Al_2O_3$-$ZrO_2$ board exhibited the coefficient of thermal expansion of 8.3 ppm/K, and the Young's modulus of 380 GPa.

Example 9

For the member 14, a silicon carbide (SiC) board was prepared having a thickness of 0.3 mm. Otherwise, features thereof were the same as those of Example 7, and ten of such evaluation samples according to Example 9 were prepared. The SiC board exhibited the coefficient of thermal expansion of 3.8 ppm/K, and the Young's modulus of 390 GPa.

Example 10

For the member 14, a zirconia ($ZrO_2$) board was prepared having a thickness of 0.3 mm. Otherwise, features thereof were the same as those of Example 7, and ten of such evaluation samples according to Example 10 were prepared. The $ZrO_2$ board exhibited the coefficient of thermal expansion of 10.5 ppm/K, and the Young's modulus of 200 GPa.

Example 11

For the member 14, a silicon (Si) board was prepared having a thickness of 0.3 mm. Otherwise, features thereof were the same as those of Example 7, and ten of such evaluation samples according to Example 11 were prepared. The Si board exhibited the coefficient of thermal expansion of 3.9 ppm/K, and the Young's modulus of 190 GPa.

Example 12

For the member 14, a tungsten (W) board was prepared having a thickness of 0.3 mm. Otherwise, features thereof were the same as those of Example 7, and ten of such evaluation samples according to Example 12 were prepared. The W board exhibited the coefficient of thermal expansion of 4.3 ppm/K, and the Young's modulus of 345 GPa.

Example 13

For the member 14, a tungsten-copper (W—Cu) board was prepared having a thickness of 0.3 mm. Otherwise, features thereof were the same as those of Example 7, and ten of such evaluation samples according to Example 13 were prepared. The W—Cu board contained 80% by mass W and 20% by mass Cu. The W—Cu board exhibited the coefficient of thermal expansion of 8.3 ppm/K, and the Young's modulus of 290 GPa.

<Evaluation>

In a similar manner to that of First Example, as an evaluation method, a heat cycle test was carried out over a temperature range of −40° C. to 125° C. The number of cycles was 100 cycles. Per each cycle, the temperature was held at −40° C. (low temperature) for 30 minutes and at 125° C. (high temperature) for 30 minutes. Upon completion of the heat cycle test, the occurrence ratio of cracks in the bonding layer 18 was evaluated. The evaluation results are shown in the following Table 3. In Table 3, the ratios are expressed by [The Number of Evaluation Samples in which Cracks were Generated]/[The Evaluation Sample Parameter (=10)], as with Table 1.

TABLE 3

|  | MATERIAL OF MEMBER (ANNULAR ARRANGEMENT) | COEFFICIENT OF THERMAL EXPANSION (ppm/K) | YOUNG'S MODULUS (GPa) | OCCURRENCE RATIO OF CRACKS IN BONDING LAYER |
|---|---|---|---|---|
| EXAMPLE 7 | $Al_2O_3$ | 7.2 | 310 | 0/10 |
| EXAMPLE 8 | $Al_2O_3$—$ZrO_2$(20%) | 8.3 | 380 | 0/10 |
| EXAMPLE 9 | SiC | 3.8 | 390 | 0/10 |
| EXAMPLE 10 | $ZrO_2$ | 10.5 | 200 | 1/10 |
| EXAMPLE 11 | Si | 3.9 | 190 | 0/10 |
| EXAMPLE 12 | W | 4.3 | 345 | 0/10 |
| EXAMPLE 13 | W—Cu(20%) | 8.3 | 290 | 0/10 |

From Table 3, it can be understood that, among the evaluation samples according to Examples 7 to 13 except for Example 10, cracks were not generated in any of the bonding layers 18. This can be considered to have occurred from the fact that, because the member 14 was bonded to the front surface 12a of the electrode material 12, thermal expansion of the electrode material 12, which is generated during the heat cycle, and in particular, thermal expansion of a surface on which at least the power semiconductor 20 is mounted, could be suppressed, and thermal stresses applied to the bonding layer 18 were alleviated.

In Example 10, although in one evaluation sample among the ten evaluation samples cracks were generated in the bonding layer 18, this stays at a practically acceptable level. The reason why cracks were generated only in Example 10 can be considered as follows. Among Examples 7 through 13, the $ZrO_2$ board of Example 10 exhibited the coefficient of thermal expansion which is the closest to that of electrode material 12 (16.5 ppm/K).

The heat dissipating circuit board and the electronic device according to the present invention are not limited to the aforementioned embodiments. Various alternative or additional structures may be adopted therein without deviating from the essential scope of the invention as set forth in the appended claims.

What is claimed is:

1. A heat dissipating circuit board for a power semiconductor, comprising:
    an electrode material on which the power semiconductor is mounted on a front surface thereof; and
    a member bonded to a front surface side of the electrode material,
    wherein the member is made up from a material which exhibits a lower coefficient of thermal expansion than that of the electrode material, and which exhibits a higher Young's modulus than that of the electrode material.

2. The heat dissipating circuit board according to claim 1, wherein the member is formed in an annular shape along an outer circumference of the front surface of the electrode material.

3. The heat dissipating circuit board according to claim 1, wherein a plurality of the members are provided, the plural members being arranged along an outer circumference of the front surface of the electrode material.

4. The heat dissipating circuit board according to claim 1, wherein two of the members are bonded at linearly symmetric positions.

5. The heat dissipating circuit board according to claim 1, wherein a portion of the member extends out in a transverse direction beyond an outer circumference of the front surface of the electrode material.

6. The heat dissipating circuit board according to claim 1, wherein entirety of the member is bonded within the front surface of the electrode material.

7. The heat dissipating circuit board according to claim 1, wherein:
    a portion of the front surface of the electrode material includes a recess therein; and
    the member is bonded in the recess.

8. The heat dissipating circuit board according to claim 1, further comprising a ceramic substrate, which is bonded to a rear surface of the electrode material.

9. The heat dissipating circuit board according to claim 8, wherein at least material properties and thicknesses of the member and the ceramic substrate are adjusted so as to suppress warping of the heat dissipating circuit board.

10. The heat dissipating circuit board according to claim 8, wherein a constituent material of the member is a ceramic material, which is the same as the ceramic material of the ceramic substrate.

11. The heat dissipating circuit board according to claim 8, wherein a constituent material of the ceramic substrate is silicon nitride.

12. The heat dissipating circuit board according to claim 8, further comprising another electrode material, which is bonded to an end surface of the ceramic substrate.

13. The heat dissipating circuit board according to claim 12, wherein a thickness of the electrode material is greater than a thickness of the other electrode material.

14. The heat dissipating circuit board according to claim 13, wherein an inequality $$t1 > tb > t2$$

is satisfied, where tb represents a thickness of the ceramic substrate, t1 represents the thickness of the electrode material, and t2 represents the thickness of the other electrode material.

15. An electronic device comprising:
    a heat dissipating circuit board for a power semiconductor; and
    a power semiconductor, which is mounted on a front surface of an electrode material of the heat dissipating circuit board,
    the heat dissipating circuit board comprising:
    the electrode material; and
    a member bonded to a front surface side of the electrode material,
    wherein the member is made up from a material which exhibits a lower coefficient of thermal expansion than that of the electrode material, and which exhibits a higher Young's modulus than that of the electrode material.

* * * * *